United States Patent [19]
Apostolos

[11] Patent Number: 4,649,392
[45] Date of Patent: Mar. 10, 1987

[54] TWO DIMENSIONAL TRANSFORM UTILIZING ULTRASONIC DISPERSIVE DELAY LINE

[75] Inventor: John T. Apostolos, Merrimack, N.H.

[73] Assignee: Sanders Associates, Inc., Nashua, N.H.

[21] Appl. No.: 460,216

[22] Filed: Jan. 24, 1983

[51] Int. Cl.$^4$ .................. G01S 3/72; G01R 23/175; H03H 9/44

[52] U.S. Cl. ..................... 342/192; 342/417; 333/150; 333/154; 333/196; 324/77 B; 324/77 H; 364/826

[58] Field of Search ............... 343/55 A, 16 R, 18 E, 343/375, 413, 5 FT, 417; 367/103, 128, 129; 310/334, 320; 333/141, 142, 145, 147, 150, 189, 154, 196; 324/77 B, 77 C, 77 CS; 364/819, 821, 824, 825, 826, 516, 376, 827, 861

[56] References Cited

U.S. PATENT DOCUMENTS

| | | | |
|---|---|---|---|
| 3,264,583 | 6/1963 | Fitch | 333/30 |
| 3,435,381 | 4/1966 | Tournois | 333/30 |
| 3,522,557 | 7/1963 | Duncan et al. | 333/30 |
| 3,719,906 | 11/1970 | Tournois | 333/30 |
| 3,727,718 | 4/1973 | Whitehouse | 333/154 X |
| 3,795,000 | 2/1974 | Bell, Jr. et al. | 367/129 |
| 3,925,653 | 12/1975 | Otto | 324/77 B X |
| 3,946,388 | 3/1976 | Schifrine | 343/5 R X |
| 3,955,137 | 5/1976 | Harrington et al. | 324/77 B X |
| 4,114,116 | 9/1978 | Reeder | 333/150 |
| 4,131,852 | 12/1978 | Holland-Moritz | 324/77 B X |
| 4,200,840 | 4/1980 | Tsui | 343/53 A X |
| 4,204,262 | 5/1980 | Fitelson et al. | 333/150 X |
| 4,236,159 | 11/1980 | Alpers | 342/378 |
| 4,245,333 | 1/1981 | Jelks | 333/150 X |
| 4,270,209 | 5/1981 | Albanese | 455/226 X |
| 4,297,704 | 10/1981 | Marom et al. | 343/5 SA X |
| 4,305,159 | 1/1978 | Stromswold et al. | 455/226 |
| 4,320,400 | 3/1982 | Chasek | 342/378 |
| 4,321,565 | 3/1982 | Ward | 333/154 X |
| 4,443,801 | 4/1984 | Klose et al. | 342/378 X |
| 4,499,393 | 2/1985 | Stokes et al. | 333/154 X |

OTHER PUBLICATIONS

M. A. Jack et al., "Two-Dimensional Transform Processor for Sonar Beamforming Using CCD and SAW Devices", Feb. 1977, *Electronic Letters*, vol. 13, #3, pp. 65–66.
J. H. Elliott, "SAWFAST: A SAW Diffraction Channelizer", *Microwave Journal*.
Klose et al., *A SAW Interferometer D–F and Frequency Identification Method*, Jun. 1981, pp. 392–394, Conf. 1981 IEEE Int. Microwave Symp., LA, CA, USA.
Coppock et al., *Bragg Cell RF Signal Processing*, Microwave Journal, vol. 21, No. 9, Sep. 1978, pp. 62–65.
Moule et al., *AlGHz Bandwidth SAW Compressive Receiver*, 1980 Ultrasonics Symposium, Proc., Boston, Ma., USA, Nov. 1980, pp. 216–219.
Viktorov, Igor Aleksandrovich, *Rayleigh and Lamb Waves*, (Plenum Press, New York, 1967), pp. 67–75.
Lamb, Horace, "On Waves in an Elastic Plate", *Proceedings of the Royal Society, Series A*, 1917, pp. 114–128.

*Primary Examiner*—T. H. Tubbesing
*Assistant Examiner*—Gilberto Barrón, Jr.
*Attorney, Agent, or Firm*—Richard I. Seligman

[57] ABSTRACT

The invention of this disclosure comprises a system that simultaneously determines the frequency and direction of arrival of incoming signals. The apparatus of this invention comprises a layered half space dispersive delay line which is utilized as a beam forming element in a device that performs a two-dimensional Fourier transform on a function which is both time and space dependent.

A pulse appears at the end of the delay line at a time which corresponds to the frequency of the incoming signal and the position of the pulse along the edge of the delay line is related to the direction of arrival of the incoming signals.

21 Claims, 3 Drawing Figures

TWO DIMENSIONAL TRANSFORM UTILIZING ULTRASONIC DISPERSIVE DELAY LINE

FIELD OF THE INVENTION

This invention relates to compressive receivers and more particularly, to a two-dimensional compressive receiver that simultaneously determines the frequency and direction of arrival of an incoming signal.

BACKGROUND OF THE INVENTION

Man has engaged in war on the land, in the sea, in the air and in the electromagnetic spectrum. The electromagnetic spectrum has been used by the military for improved communications, guidance of aircraft and missiles and the navigation of ships and planes. A nation seeks control of the electromagnetic spectrum because of the military's increasing dependency on its use for surveillance of potential enemy forces, communications between military units, detection of enemy military forces and the guidance and control of airplanes and missiles. With a mastery of the electromagnetic spectrum, one adversary could achieve an indispensable ingredient for conquering an enemy or discouraging a potential aggressor.

One of the most important problems in electronic surveillance involves the recognition of a signal in a multisignal environment and the determination of its direction of arrival. In the past, it has been common to use a one-dimensional compressive receiver or spectrum analyzer, which decomposed the frequency of the electromagnetic spectrum into bins. If a signal appeared in a bin in which it was not previously present, a new signal would have arrived. This new signal now had to be investigated, i.e., what kind of modulation is on it, what is its direction of arrival, in order to determine if the signal was produced by a friend or a foe. Some disadvantages of the foregoing was that this procedure was a time consuming, sequential process that used: a compressive receiver for rapidly sweeping a given band of frequencies to determine the presence or existence of a signal and its frequency; a plurality of analysis receivers for analyzing the kind of modulation that is on the signal, one analysis receiver being assigned to a bin that just received a new signal and some antenna receivers that acted as an interferometer by determining the direction of arrival of the incoming signal by detecting the signal's phase shifts.

The analysis receivers that were used in the aforementioned system required a large amount of space and were expensive. Hence, there was a limited number of analysis receivers, i.e., six (6) that were utilized in prior art systems. Thus, if the new signal birth rate was too high, there would not be enough analysis receivers to process all of the incoming signals.

SUMMARY OF THE INVENTION

This invention overcomes the disadvantages of the prior art by providing a Two-Dimensional Compressive Receiver that simultaneously determines the frequency spectrum and direction of arrival of incoming signals. By immediately knowing the direction of arrival of all detected signals, this system does not have to analyze all of the incoming signals for the reason that the location of the signals produced by friendly ships, tanks, airplanes, etc. are known. Thus, the foregoing system has the ability to filter signals by permitting the system to concentrate the search effort in certain sectors where intelligence believes there is the largest enemy concentration.

In essence, the apparatus of this invention is an ultrasonic layered half space dispersive delay line or lamb wave dispersive delay line which is utilized as a beam forming element in a compressive receiver. The compressive receiver performs a Fourier transform on a time function via the chirp transform algorithm. The beam forming delay line transmits the output of the compressive receiver so that the compressed pulse appears at the end of the delay line (at a time which corresponds to the frequency of the incoming wave), and the position of the compressed pulse along the edge of the delay line is related to the direction of arrival of the incoming signal. The width in frequency (time) and the width in direction of arrival (X) of the pulse depend upon the length of the delay line and the length of the antenna array. For the normal case of signals on many different frequencies and from many different directions of arrivals, the pattern on the output edge of the delay line is a two-dimensional transform of the input time-space (element) domain with the frequency coordinate readout in time and the direction of arrival coordinate readout along the delay line edge (X).

It is an object of this invention to provide a new and improved Two-Dimensional Fourier Transform device that simultaneously determines the frequency spectrum and direction of arrival of incoming signals.

Other objects and advantages of this invention will become apparent as the following description proceeds, with description should be considered together with the accompanying drawings.

DESCRIPTION OF A PREFERRED EMBODIMENT

Figure 1:
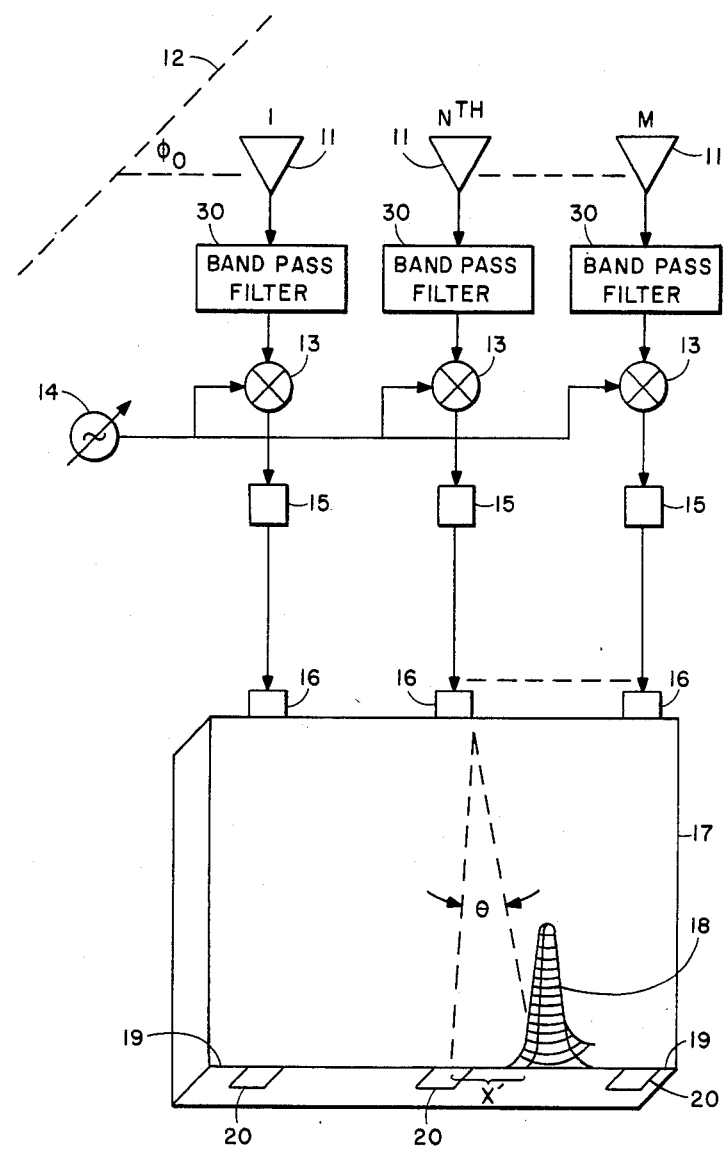
FIG. 1 is a block diagram of the apparatus of this invention.

Referring now to the drawings in detail, and more particularly to FIG. 1, the reference character 11 represents an M element linear antenna array, having a first element 1 and an $N^{th}$ element N, with one of many possible incident wavefronts 12 that arrive at different times at the input of elements 1 through M at an angle of $\phi_0$. The output of antennas 11 are coupled to the inputs of a plurality of band pass filters 30 in order to limit the input bandwidth. The output of filters 30 are coupled to one of the inputs of an M element plurality of mixers 13. The corresponding number of each antenna element 11 being connected to the corresponding number of each filter element 30 and the corresponding number of each filter element 30 being connected to the corresponding number of each mixer element 13. The second input to mixer 13 is the output of a variable frequency swept oscillator or chirp 14.

Oscillator 14 is swept in a periodic fashion. The outputs of mixers 13 are applied to the respective inputs of M conventional weighting network 15. Network 15 reduces the compressed pulse time side lobes of its input signals, thus, removing any false signals that appear to exist in any bins. The outputs of networks 15 are respectively coupled to the inputs of a plurality of edge mounted transducers 16. The corresponding number of each network element 15 is coupled to the corresponding number of each transducer element 16. Transducer 16 converts the electrical energy of mixers 15 into acoustic energy. Transducers 16 are connected to the forward edge of delay line 17 and generate acoustic waves that travel through delay line 17. Delay line 17 has a length 1 and a width X. The waves that propagate through delay line 17 form an interference pattern within line 17 which produces a plurality of pulses 18 that dart out along edge 19 of line 17. Each pulse 18 represents a different waveform that was received by antennas 11. Pulses 18 are detected by a plurality of edge mounted output transducers 20. Transducers 20 are mounted to the back edge of line 17 and convert the acoustic energy contained in space 17 into electrical energy. The position of a particular transducer 20 along edge 19 that detects the pulse 18 at a given time is related to the direction of arrival of wavefront 12. The time that pulse 18 has arrived at detector 20 determines the frequency of the energy received by the antennas. Thus, the direction of arrival and frequency of incoming signals is determined at the same time. In order to improve the focusing at edge 19 a slight convex curvature should be placed on the forward edge of space 17. The detected pulse 18 at a given time may be represented by the following equation:

$$V = Ce^{-\gamma l2} \frac{\text{SIN} \frac{M}{2} \psi}{\text{SIN} \frac{1}{2} \psi}$$

where
V = voltage of pulse 18 as detected by detector 20
C = a constant $\psi = 2\pi d_\lambda \phi - \psi_o$ $\gamma = k^2/\beta^2$ $d_\lambda$ is the transducer spacing in acoustic wavelengths at $F_L$ (center frequency).
M = Number of input transducers 16
$\beta = \frac{1}{2}/T$ (weighting factor for 50 dB side lobes)
T = differential delay
k = time delay slope
$\phi_o$ = angle that wavefront 12 is traveling relative to antennas 11
$\psi_o = 2\pi S_\lambda \sin \phi_o$ where $S_\lambda$ is the antenna array 11 spacing
$\phi = \tan^{-1} X'/l$
l = length of layered half space 17
X' = the location along the X axis that the pulse 18 was detected in a given time or the distance of the detector 20, that detected the pulse 18 in a given time from the edge of layered half space 17 having width X.

The frequency f, of the detected pulse 18 is represented by the following equation:

$f = Kt + f_o$ where
$f_o$ is the frequency of the pulse that arrives at t=o
t = time of pulse arrival
K = time delay slope Thus, by knowing the time of arrival of pulse 18 at the output of detector 20, one may determine the frequency of pulse 18.

Figure 2:
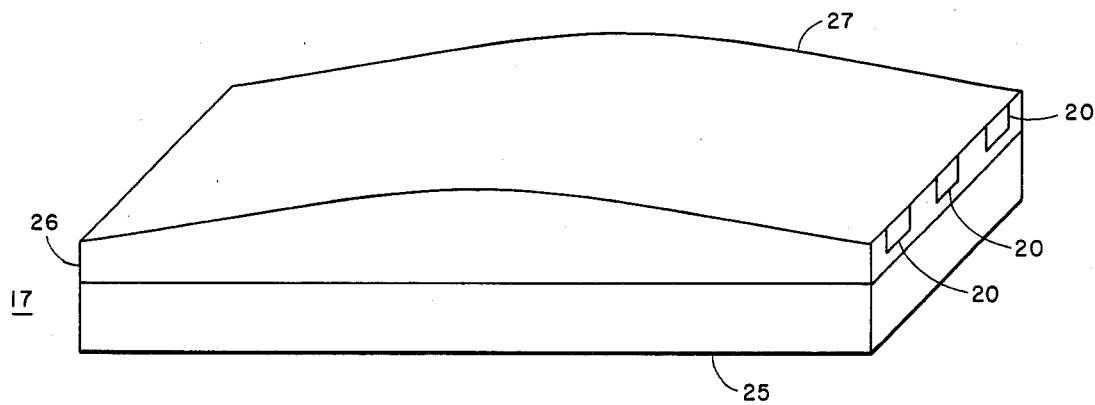
FIG. 2 is a perspective diagram of the layered half space surface acoustic wave beam forming delay line 17 of FIG. 1 shown in greater detail.

FIG. 2 shows the delay line 17 as a layered half space delay line 17 with transducers 20 and transducers 16 (not shown) of FIG. 1 in greater detail. Space 17 comprises two layers, a bottom layer 25 and a top layer 26. Bottom layer 25 is a sapphire substrate and top layer 26 may be any number of thin films, i.e., Quartz ($SiO_2$), Zinc Selenide (ZnSe), Gallium Arsenide (GaAs) and Zinc Oxide (ZnO). Layer 26 is deposited on layer 25 by procedures similar to the ones described in the book entitled "Thin Film Process", Ed. by John L. Vossen and Werner Kern, Pub. 1978, by Academic Press, Inc. Layer 26 is contoured and the shape of contour 27 is dependent upon which one of the aforementioned materials is selected for layer 26. Contour 27 insures that a linear time delay vs. frequency characteristic will exist for space 17. The method for determining a linear time delay vs. frequency characteristics is described in an article by D. P. Morgan entitled "Acoustic-Surface-wave Dispersive Delay Line". The aforementioned article was published in July, 1969 in the Proceedings of the Institution of Electrical Engineers, Vol. 116, No. 7.

Figure 3:
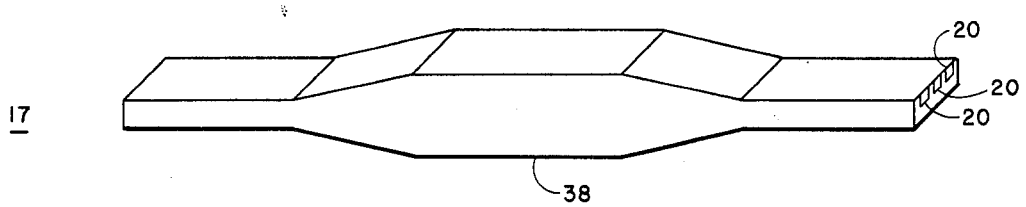
FIG. 3 is a perspective diagram of the lamb wave beam forming dispersive delay line 17 of FIG. 1 shown in greater detail.

FIG. 3 shows an alternate and preferred embodiment of the delay line 17. Delay line 17 in the preferred embodiment is a lamb wave dispersive delay line with transducers 20 and transducers 16 (not shown) of FIG. 1 in greater detail. Delay line 17 is a tapered slab of material 38. Material 38 may be quartz or sapphire. Material 38 is tapered and the shape of the taper is dependent upon which one of the aforementioned materials is selected for material 38. The taper on material 38 insures that a linear time delay vs. frequency characteristic will exist for line 17. The method for determining a linear time delay vs. frequency characteristics is described in an article by A. H. Fitch which appears in Vol. 35 of The Journal of the Acoustical Society of America, pages 709-714, published in 1963.

The above specification describes a new and improved two dimensional Fourier transform. It is realized that the above description may indicate to those skilled in the art additional ways in which the principles of this invention may be used without departing from its spirit. It is, therefore, intended that this invention be limited only by the scope of the appended claims.

What is claimed is:
1. A system for simultaneously determining the frequency spectrum and direction of arrival of incoming signals, said system comprising:
   means for converting the incoming signals into acoustic energy;
   a Lamb wave dispersive delay line whose input is coupled to the output of said converting means so that an interference pattern will travel through said delay line as a series of acoustic pulses;
   means for converting the acoustic output of said delay line into electrical pulses;
   whereby, the position of one of the electrical pulses along an edge of said delay line at a given time is related to the direction of arrival of one of the incoming signals and the time that said one electrical pulse exits said delay line determines the frequency of said incoming signal.
2. The system claimed in claim 1 wherein said means for converting the electrical output of said receiver into acoustic energy are a plurality of transducers.

3. The system claimed in claim 1 wherein said means for converting the acoustic output of said line into electrical energy are a plurality of transducers.

4. The system claimed in claim 1 wherein said delay line is a slab of material selected from the group consisting of quartz or sapphire.

5. A system for simultaneously determining the frequency spectrum and direction of arrival of incoming signals, said system comprising:
   means for converting the incoming signals into acoustic energy;
   a layered half space dispersive delay line whose input is coupled to the output of said converting means so that an interference pattern will travel through said delay line as a series of acoustic pulses;
   means for converting the acoustic output of said delay line into electrical pulses;
   whereby, the position of one of the electrical pulses along an end edge of said delay line at a given time is related to the direction of arrival of one of the incoming signls and the time that said one electrical pulse exits said delay line determines the frequency of said incoming signal.

6. The system claimed in claim 5 wherein said means for converting the electrical output of said receiver into acoustic energy are a plurality of transducers.

7. The system claimed in claim 5 wherein said means for converting the acoustic output of said line into electrical energy are a plurality of transducers.

8. The system claimed in claim 5 wherein said delay line has a top layer and a bottom layer.

9. The system claimed in claim 8 wherein said bottom layer comprises a sapphire substrate.

10. The system claimed in claim 8 wherein said top layer comprises a thin film selected from the group consisting of Quartz, Zinc Selenide, Gallium Arsenide, and Zinc Oxide.

11. The system claimed in claim 8 wherein said top layer is contoured so that a linear time delay vs. frequency characteristic will exist for said line.

12. Apparatus for simultaneously determining a two dimensional spatial and frequency transform of a plurality of transmitted radio signals, comprising:
   (a) an integral number, M, of linearly spaced radiation receivers, arranged to receive the transmitted radio signals, each receiver thereby outputting a received signal;
   (b) a variable frequency sweeping periodic oscillator which outputs a sweep signal;
   (c) a plurality of mixers, a corresponding one for each of the M radiation receivers, each mixer connected to receive the received signal output from its associated radiation receiver and each mixer connected to receive the sweep signal, so that each mixer thereby outputs a corresponding one of M chirped signals; and
   (d) means for two-dimensional dispersive delay, connected to receive each of the M chirped signal outputs from their associated mixers, said delay means further arranged to provide a plurality, N, where N does not necessarily equal M, of transformed output signals in which, for each transformed output signal, one or more pulses are periodically output for each of the transmitted radio signals, and in which the relative position in time of each pulse indicates one component of the frequency transform of the transmitted signals and the relative position in space of each pulse indicates one component of the spatial transform of the transmitted signals. associated with one of the transformed output signals, thereby providing the N transformed output signals.

13. Apparatus as in claim 12 wherein said two dimensional dispersive delay means comprises:
   (a) a plurality, M, of input transducers connected to receive the M chirped signal outputs, each input transducer associated with its corresponding chirped signal output, for outputting M acoustic chirped signals which represent the chirped signals in acoustic form;
   (b) a slab of acoustic wave propagating material, having an output edge, connected to receive the M acoustic chirped signals, and arranged to dispersively propagate the acoustic chirped signals in Lamb wave mode, thereby providing, at the output edge, a plurality of transformed acoustic signals; and
   (c) a plurality, N, of output transducers arranged proximate to the output edge and connected to receive the plurality of transformed acoustic signals, each output transducer 14. Apparatus in claim 13 wherein said slab of acoustic wave propagating material is formed of quartz.

15. Apparatus as in claim 13 wherein said slab of acoustic wave propagating material is formed of sapphire.

16. Apparatus as in claim 12 wherein said two dimensional dispersive delay means comprises:
   (a) a plurality, M, of input transducers connected to receive the M chirped signal outputs, each input transducer associated with its corresponding chirped signal output, for outputting M acoustic chirped signals which represent the chirped signals in acoustic form;
   (b) a slab of acoustic wave propagating material, having an output edge, connected to receive the M acoustic chirped signals, and arranged to dispersively propagate the acoustic chirped signals in layered half-space mode, thereby providing, at the output edge, a plurality of transformed acoustic signals; and
   (c) a plurality, N, of output transducers arranged proximate to the output edge and connected to receive the plurality of transformed acoustic signals, each output transducer associated with one of the transformed output signals, thereby providing the N transformed output signals.

17. Apparatus as in claim 16 wherein said slab of acoustic wave propagating material comprises:
   (a) a bottom layer; and
   (b) a top layer.

18. Apparatus as in claim 17 wherein said bottom layer is formed of sapphire.

19. Apparatus as in claim 17 wherein said bottom layer comprises a thin film formed from one of the group of materials consisting of Quartz, Zinc Selenide, Gallium Arsenide and Zinc Oxide.

20. Apparatus as in claim 17 wherein said top layer is contoured in such a manner as to enhance the time delay linearity of said two-dimensional dispersive means.

21. In an electronic surveillance system of the type in which a compressive receiver is used to obtain the frequency transform of a plurality of electromagnetic signals received by an array of linearly spaced radiation receivers, the improvement comprising:

a two dimensional dispersive delay line, having an input edge and an output edge, arranged to receive the plurality of electromagnetic signals at the input edge, thereby providing at the output edge, a plurality of pulses in which the relative position in time of a particular pulse indicates a component of the frequency transform of one of the electromagnetic signals and the relative spatial position of a pulse along the output edge indicates a component of the spatial transform of one of the electromagnetic signals.

* * * * *